(12) United States Patent
Roh

(10) Patent No.: US 11,894,627 B2
(45) Date of Patent: *Feb. 6, 2024

(54) DISPLAY DEVICE AND METHOD FOR MANUFACTURING THE SAME

(71) Applicant: Samsung Display Co., LTD., Yongin-si (KR)

(72) Inventor: Myonghoon Roh, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/571,644

(22) Filed: Jan. 10, 2022

(65) Prior Publication Data
US 2022/0131290 A1 Apr. 28, 2022

Related U.S. Application Data

(63) Continuation of application No. 16/783,259, filed on Feb. 6, 2020, now Pat. No. 11,239,584.

(30) Foreign Application Priority Data

Mar. 21, 2019 (KR) .......................... 10-2019-0032557

(51) Int. Cl.
| H01L 51/52 | (2006.01) |
| H01L 51/00 | (2006.01) |
| H01R 12/62 | (2011.01) |
| H01R 43/02 | (2006.01) |
| G06F 3/041 | (2006.01) |
| H05K 1/02 | (2006.01) |

(Continued)

(52) U.S. Cl.
CPC ......... *H01R 12/62* (2013.01); *G06F 3/04164* (2019.05); *H01R 43/0207* (2013.01); *H05K 1/0277* (2013.01); *H05K 1/111* (2013.01); *H05K 1/142* (2013.01)

(58) Field of Classification Search
CPC .................................................... G06F 3/0446
See application file for complete search history.

(56) References Cited

U.S. PATENT DOCUMENTS 5,235,451 A * 8/1993 Bryan ................. G02F 1/13452
349/149
9,980,376 B1 5/2018 Kim et al.
(Continued)

FOREIGN PATENT DOCUMENTS

| CN | 107680986 A | 2/2018 |
| KR | 101740006 B1 | 6/2017 |
| KR | 1021080000046 A | 1/2018 |

Primary Examiner — Nan-Ying Yang
(74) Attorney, Agent, or Firm — CANTOR COLBURN LLP

(57) ABSTRACT

A display device includes a display panel including a plurality of panel pads, a connection board including a plurality of connection lines, and a circuit board including a plurality of board pads. The plurality of connection lines are spaced apart from each other. Each of a connection line among the plurality of connection lines includes: a first end portion at which the connection line is connected to the display panel, the first end portion being in direct contact with a panel pad, and a second end portion opposite to the first end portion and at which the connection line is connected to the circuit board, the second end portion being in contact with a board pad.

19 Claims, 12 Drawing Sheets

(51) Int. Cl.
  *H05K 1/14* (2006.01)
  *H05K 1/11* (2006.01)

(56) References Cited

U.S. PATENT DOCUMENTS

| | | | |
|---|---|---|---|
| 10,410,987 | B2 | 9/2019 | Kim et al. |
| 2003/0090887 | A1* | 5/2003 | Igarashi ............... G02B 6/0028 362/617 |
| 2006/0033875 | A1* | 2/2006 | Lin ....................... G02F 1/1345 349/152 |
| 2014/0184989 | A1* | 7/2014 | Park ................. G02F 1/136204 445/24 |
| 2015/0230337 | A1* | 8/2015 | Kim ....................... H05K 1/118 29/830 |
| 2017/0123557 | A1* | 5/2017 | Na ....................... G06F 3/04166 |
| 2017/0287427 | A1* | 10/2017 | Kim .................... G09G 3/3696 |
| 2017/0352834 | A1* | 12/2017 | Kim .................... H01L 51/5253 |
| 2018/0131031 | A1 | 5/2018 | Ku et al. |
| 2018/0267381 | A1* | 9/2018 | Leoni ..................... G02F 1/167 |
| 2019/0172896 | A1 | 6/2019 | Kim et al. |

* cited by examiner

DISPLAY DEVICE AND METHOD FOR MANUFACTURING THE SAME

This application claims priority to Korean Patent Application No. 10-2019-0032557, filed on Mar. 21, 2019, and all the benefits accruing therefrom under 35 U.S.C. § 119, the content of which in its entirety is herein incorporated by reference.

BACKGROUND

1. Field

Exemplary embodiments of invention relate to a display device. More particularly, exemplary embodiments of invention relate to a display device which includes a connection board connected to a display panel.

2. Description of the Related Art

Various display devices used in multimedia apparatuses such as televisions, mobile phones, tablet computers, navigation devices and game consoles are being developed.

The display devices include a display panel for displaying an image. The display panel includes a plurality of scan lines, a plurality of data lines and a plurality of pixels. The display panel may be electrically connected to a circuit board which provides driving signals.

SUMMARY

Exemplary embodiments of invention provide a display device in which the connection reliability between a display panel and a circuit board is improved, and a method for manufacturing the display device.

In an exemplary embodiment of the invention, a display device includes a display panel including a plurality of panel pads through which a driving signal is provided to the display panel from outside thereof; a circuit board electrically connected to the display panel and including a plurality of first board pads through which the driving signal is provided from the circuit board to outside thereof; and a connection board which electrically connects the display panel to the circuit board, the connection board including a plurality of connection lines spaced apart from each other and through which the driving signal is transmitted from the circuit board to the display panel. Each of a connection line among the plurality of connection lines includes: a first end portion at which the connection line is connected to the display panel, the first end portion being in direct contact with a panel pad among the plurality of panel pads, and a second end portion opposite to the first end portion and at which the connection line is connected to the circuit board, the second end portion being in contact with a first board pad among the plurality of first board pads.

In an exemplary embodiment, each of the connection board and the circuit board may be a flexible circuit board.

In an exemplary embodiment, the circuit board may further include a driving integrated circuit which provides the driving signal to drive the display panel.

In an exemplary embodiment, the first end portion which is in direct contact with the panel pad among the plurality of panel pads may include copper, and a direct bond may be defined between the panel pad and the copper at the first end portion to dispose the first end portion in direct contact with the panel pad.

In an exemplary embodiment, the first end portion may include copper, and the second end portion may include tin.

In an exemplary embodiment, the plurality of connection lines may include a first connection line disposed at a central portion of the connect board and a second connection line adjacent to the first connection line.

In an exemplary embodiment, the display panel may further include a display area, and a non-display area which is adjacent to the display area, a display element layer which corresponds to the display area, and a panel pad area in which the plurality of panel pads are disposed, the panel pad area corresponding to the non-display area.

In an exemplary embodiment, the circuit board may include a board pad area in which the plurality of first board pads are disposed.

In an exemplary embodiment, a virtual reference line may extend parallel to a first direction in which the display panel, the connection board and the circuit board are arranged, a first length of the panel pad area along a second direction crossing the first direction may be different from a second length of the board pad area along the second direction, the first connection line disposed at the central portion of the connection board along the second direction, may have a first slope with respect to the virtual reference line, and the second connection line arranged adjacent to the first connection line along the second direction, may have a second slope with respect to the virtual reference line different from the first slope.

In an exemplary embodiment, the second length may be greater than the first length, and the second slope may be greater than the first slope.

In an exemplary embodiment, the circuit board may further include second board pads, and the display device may further include a main circuit board electrically connected to the second board pads.

In an exemplary embodiment, the display device may further include a touch sensing unit on the display panel. The touch sensing unit may have a sensing area, a non-sensing area which is adjacent to the sensing area, and a plurality of touch pads in the non-sensing area.

In an exemplary embodiment, the display device may further include a touch circuit board electrically connected to the touch sensing unit and including a plurality of touch connection pads, and a touch connection board which electrically connects the touch sensing unit to the touch circuit board, the touch connection board including a plurality of touch connection lines spaced apart from each other. Each of a touch connection line among the plurality of the touch connection lines including: a first end portion at which the touch connection line is connected to the touch sensing unit, the first end portion of the touch connection line being in direct contact with a touch pad among the plurality of touch pads, and a second end portion at which the touch connection line is connected to the touch circuit board, the second end portion of the touch connection line being in contact with a touch connection pad among the plurality of touch connection pads.

In embodiment, each of the touch connection board and the touch circuit board may be a flexible circuit board.

In an exemplary embodiment, the display device may further include a touch driving integrated circuit which is mounted on the touch circuit board and provides a touch driving signal to drive the touch sensing unit.

In an exemplary embodiment, each of the plurality of touch connection lines may be include copper.

In an exemplary embodiment, the first end portion of the touch connection line which is in direct contact with the touch pad may include copper, and a direct bond may be defined between the touch pad and the copper at the first end portion of the touch connection line to dispose the first end portion of the touch connection line in direct contact with the touch pad.

In an exemplary embodiment of the invention, a method for manufacturing a display device includes providing a display panel including a panel pad through which a driving signal is provided to the display panel from outside thereof; providing a connection board including a connection line through which the driving signal is transmitted from the connection board to the display panel; contacting the panel pad to the connection line; and applying ultrasonic vibration to the panel pad and the connection line which are in contact with each other, to form a direct bond between the panel pad and the connection line.

In an exemplary embodiment, the method may further include providing a circuit board from which the driving signal is provided to the connection board, the circuit board including a first board pad through which the driving signal is provided from the circuit board to the connection board. The connection line may include a first end portion at which the connection line is electrically connected to the display panel, the direct bond defined between the first end portion of the connection line and the panel pad of the display panel, and a second end portion opposite to the first end portion and at which the connection line is electrically connected to the circuit board, the second end portion being in contact with the first board pad of the circuit board.

In an exemplary embodiment, the applying ultrasonic vibration melts a portion of the panel pad and a portion of the connection line to form the direct bond between the panel pad and the connection line.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
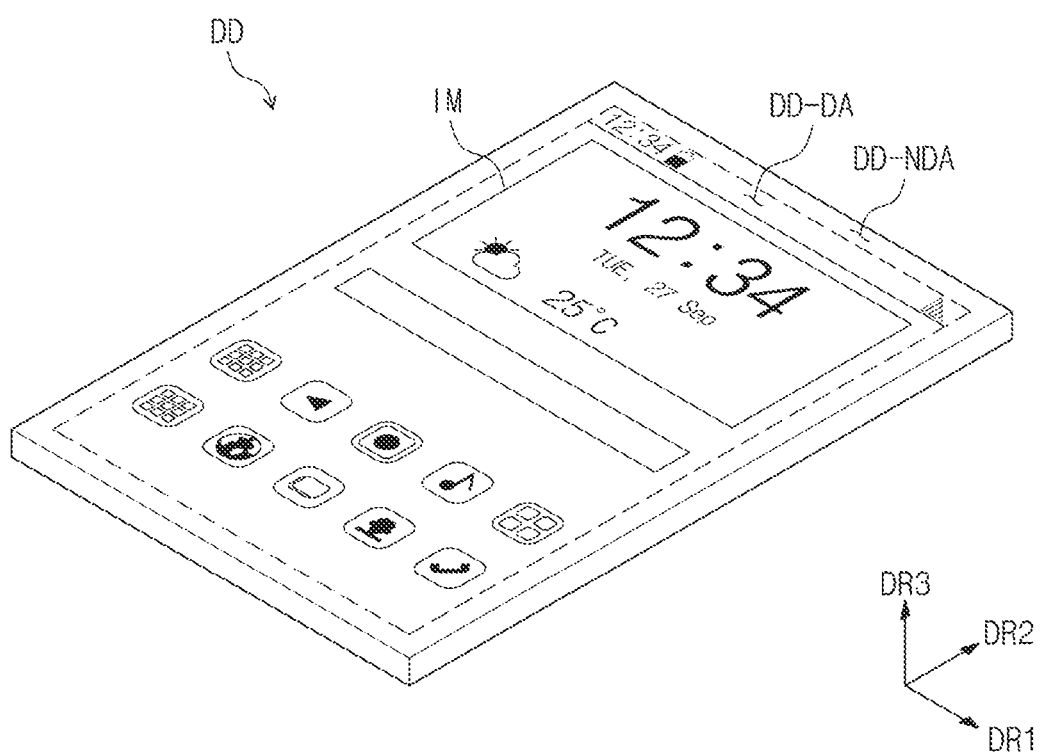
FIG. 1 is a perspective view of an exemplary embodiment of a display device.

In this specification, when a component (or a region, a layer, a portion, or the like) is referred to as being related to another component such as being "on," "connected to" or "coupled to" another component, it may be directly disposed on/connected/coupled to another component, or an intervening third component may be also disposed therebetween. In contrast, when a component (or a region, a layer, a portion, or the like) is referred to as being related to another component such as being "directly on," "directly connected to" or "directly coupled to" another component, no intervening third component is disposed therebetween The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numbers refer to like elements throughout. Also, in the drawing, the thicknesses, dimensions, and ratios of the components are exaggerated for effectively describing the technical features.

Although the terms such as first and second are used herein to describe various components, these components should not be limited by these terms. The terms are only used to distinguish one component from other components. For example, a first component may be referred to as a second component, and similarly a second component may be referred to as a first component without departing from the scope of the invention. The expression of a singular form may include plural forms unless definitely indicating a particular case in terms of the context.

Also, terms of "below," "on lower side," "above," "on upper side" or the like may be used to describe the relationships of the components illustrated in the drawings. These terms have a relative concept, and are described on the basis of the directions illustrated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the present disclosure belongs. Also, terms as defined in a commonly used dictionary should be construed as having the same meaning as in an associated technical context, and unless ideally or excessively construed as having formal meaning, the terms are defined apparently herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It should be understood that the term of "comprise," "have", or the like intends to specify the presence of a feature, a fixed number, a step, an operation, a component, or a combination thereof described in the specification, but does not exclude the possibility of presence or addition of one or more other features, fixed numbers, steps, operations, components, or combinations thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

FIG. 1 is a perspective view of an exemplary embodiment of a display device.

Referring to FIG. 1, a mobile terminal is illustrated as an example of a display device DD. The mobile terminal may include a tablet personal computer ("PC"), a smart phone, a personal digital assistant ("PDA"), a portable multimedia player ("PMP"), a game console, a wrist watch-type electronic device, or the like. However, the embodiment of the invention is not limited thereto.

One or more embodiment of the invention may be used in relatively large electronic devices such as a television or an outdoor advertisement board, and also relatively small-to-medium electronic devices such as a personal computer, a laptop computer, a vehicular navigation device, a camera. These are merely provided as examples, and one or more embodiment of the invention may be employed in other electronic apparatuses so long as not departing from the technical scope and spirit of the invention.

Also, the display device DD may be a liquid crystal display device, a field emission display device, a plasma display device or an organic light emitting display device. However, these devices are listed as examples, and thus the display device DD is not limited to the types of the above-described display devices.

As illustrated in FIG. 1, a display surface at which or through which an image IM is displayed is parallel to a first direction DR1 and a second direction DR2 which cross each other. The display device DD includes a plurality of areas distinguished on the display surface. The areas may be planar areas defined along a plane defined by the first direction DR1 and the second direction DR2 which cross each other. The display surface includes a display area DD-DA on or at which the image IM is displayed and a non-display area DD-NDA which is adjacent to the display area DD-DA. A boundary between the display area DD-DA and the non-display area DD-NDA is generally indicated by a dotted line in FIG. 1, and a shape thereof may be variously modified.

The non-display area DD-NDA may be referred to as a bezel area. In an exemplary embodiment, for example, the display area DD-DA may have a tetragonal shape in a top plan view (e.g., view along a direction normal to the display surface). The non-display area DD-NDA may surround the display area DD-DA in the top plan view. Also, although not illustrated, the display device DD may have, for an example, a partially bent shape (e.g., further extended along a third direction DR3). As a result, the shape in which a portion of the display area DD-DA is bent may be obtained.

With respect to the direction in which the image IM is displayed, a front surface (or a top surface, or a first surface) and a rear surface (or a bottom surface, or a second surface) for each member are defined. However, directions indicated as the first to third directions DR1, DR2, and DR3 may be a relative concept and thus be changed to other directions. Hereinafter, the changed directions refer to the same reference symbols as the directions indicated by the first and third directions DR1, DR2, and DR3, respectively.

Figure 2:
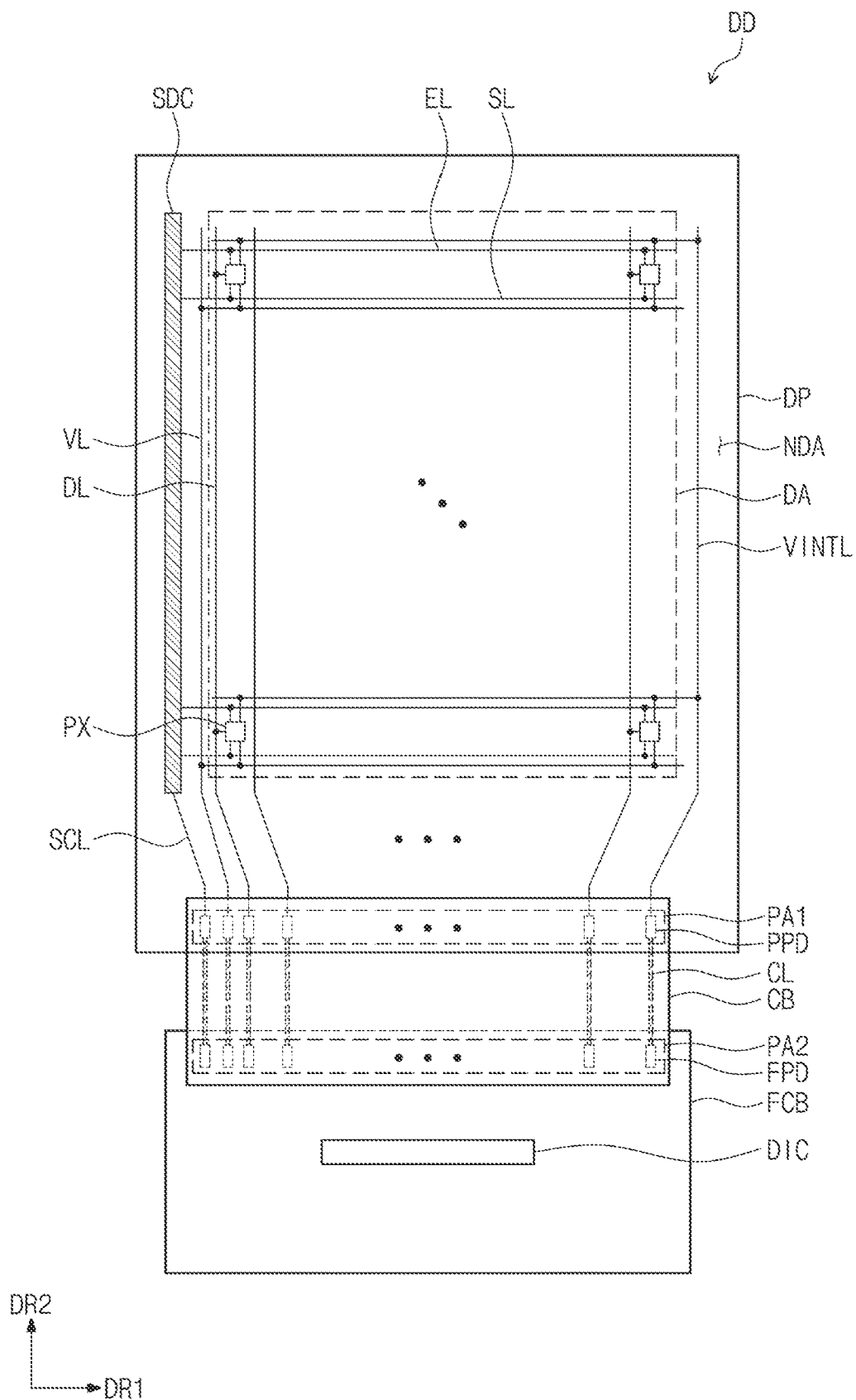
FIG. 2 is a top plan view of an exemplary embodiment of a display panel.
Figure 3:
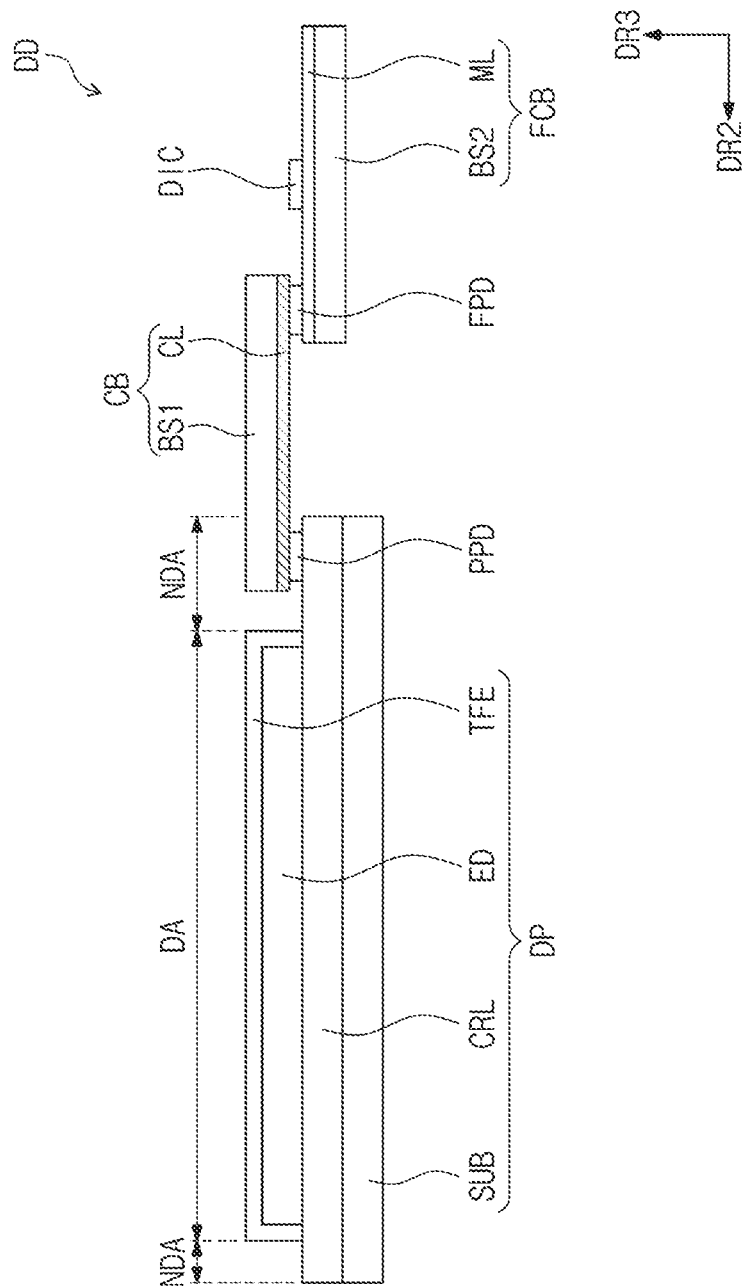
FIG. 3 is a cross-sectional view illustrating an exemplary embodiment of an end portion of a display device.

FIG. 2 is a top plan view of an exemplary embodiment of a display panel. FIG. 3 is a cross-sectional view illustrating an exemplary embodiment of an end portion of a display device.

Referring to FIG. 2 and FIG. 3, a display device DD include a display panel DP, a connection board CB, and a circuit board FCB. The connection board CB is disposed adjacent to the display panel DP and the circuit board FCB along the second direction DR2.

The display panel DP includes, in a plane parallel to a plane defined by the first direction DR1 and a second direction DR2, a display area DA and a non-display area NDA. The display area DA and the non-display area NDA of the display panel DP correspond to the display area DD-DA (refer to FIG. 1) and the non-display area DD-NDA (refer to FIG. 1) of the display device DD, respectively. The display area DA and the non-display area NDA of the display panel DP do not necessarily have to be the same as the display area DD-DA (refer to FIG. 1) and the non-display area DD-NDA (refer to FIG. 1) of the display device DD in planar size, shape, etc., and may be changed depending on a structure and/or a design of the display panel DP.

The display panel DP includes a pixel PX provided in plural (e.g., a plurality of pixels PX). An area in which the plurality of pixels PX are disposed corresponds to or is defined as the display area DA. As shown in FIG. 2, the non-display area NDA may be defined along an edge (e.g., an outer edge) of the display area DA.

Referring to FIG. 2, the display panel DP may include a scan line SL provided in plural (e.g., scan lines SL), a data line DL provided in plural (e.g., data lines DL), a light emitting line EL provided in plural (e.g., light emitting lines EL), a scan control line SCL provided in plural (e.g., scan control lines SCL), an initialization voltage line VINTL, and a voltage line VL.

On one side of the non-display area NDA, a scan driving circuit SDC to which the scan lines SL and the light emitting lines EL are connected may be disposed.

Each of the scan lines SL lengthwise extends from the scan driving circuit SDC along a first direction DR1 and is connected to a corresponding pixel PX of the plurality of pixels PX. Each of the light emitting lines EL lengthwise extends from the scan driving circuit SDC along the first direction DR1 and may be arranged in parallel to the corresponding scan line SL of the scan lines SL. Each of the data lines DL lengthwise extends along a second direction DR2 and is connected to the corresponding pixel PX of the plurality of pixels PX. The scan control line SCL may provide the scan driving circuit SDC with one or more of a control signal. The initialization voltage line VINTL may provide the plurality of pixels PX with an initialization voltage. The voltage line VL is connected to the plurality of pixels PX and may provide the plurality of pixels PX with a first voltage. The voltage line VL may include a plurality of conductive lines that lengthwise extend along the first direction DR1 and a plurality of conductive lines that extend in the second direction DR2.

Some conductive lines among the scan lines SL, the data lines DL, the light emitting lines EL, the scan control line SCL, the initialization voltage line VINTL, and the voltage line VL may be disposed in a same layer as each other, and others among the scan lines SL, the data lines DL, the light emitting lines EL, the scan control line SCL, the initialization voltage line VINTL, and the voltage line VL may be disposed in another layer. As being "in a same layer," elements may be respectively provided or formed from a same material layer, in a same manufacturing process, etc.

A panel pad PPD provided in plural (e.g., panel pads PPD) are arranged in a first pad area PA1 (e.g., panel pad area PA1) of the non-display area NDA of the display panel DP. The panel pads PPD may be arranged side-by-side along the first direction DR1. As illustrated in FIG. 2, the panel pads PPD are illustrated and described as being arranged in a line along the first direction DR1, but the invention is not limited thereto. In an exemplary embodiment, for example, the panel pads PPD may be arranged in two or more rows, or may be arranged in zigzag shape along the first direction DR1.

The data lines DL, the scan control line SCL, the initialization voltage line VINTL, and the voltage line VL are connected to the panel pads PPD.

The circuit board FCB may be a flexible printed circuit board ("FPCB") on which a driving integrated circuit ("IC") DIC may be mounted. In an exemplary embodiment, for example, the circuit board FCB may be a chip on film ("COF") structure. Only one driving integrated circuit DIC is shown on the circuit board FCB of FIG. 2, but several integrated circuits may be mounted on the circuit board FCB. Also, the driving integrated circuit DIC may include a driving controller, a data driver, a voltage generator or the like.

A first board pad FPD provided in plural (e.g., first board pads FPD) are arranged in a second pad area PA2 (e.g., board pad area PA2) of the circuit board FCB. The first board pads FPD may be arranged side-by-side along the first direction DR1. As illustrated in FIG. 2, the first board pads FPD are illustrated and described as being arranged in a line along the first direction DR1, but the invention is not limited thereto. In an exemplary embodiment, for example, the first board pads FPD may be arranged in two or more rows, or may be arranged in zigzag shape along the first direction DR1.

As illustrated in FIG. 2, the number of the first board pads FPD is equal to the number of the panel pads PPD, but the invention is not limited thereto. In an embodiment, for example, the number of the first board pads FPD may be greater or less than the number of the panel pads PPD.

The connection board CB may electrically connect the panel pads PPD of the display panel DP and the first board pads FPD of the circuit board FCB to each other. The connection board CB includes a connection line CL provided in plural (e.g., connection lines CL). Each of the connection lines CL lengthwise extends along the second direction DR2. The connection lines CL are arranged spaced apart from each other along the first direction DR1.

As illustrated in FIG. 3, a first end portion of each of the connection lines CL is connected to a panel pad PPD (e.g., by direct contact therewith) among the plurality of panel pads PPD, and a second end portion opposite to the first end portion is connected to a first board pad FPD (e.g., by direct contact therewith) among the plurality of first board pads FPD. That is, the connection lines CL may be connected to other components of the display device DD, at the first end portion and the second end portion. Each of the first end portion and the second end portion may respectively define a distal end of a connection line CL.

Each of the connection lines CL may include a conductive material. In an exemplary embodiment, for example, the conductive material may include or be made of one selected from copper (Cu), gold (Au), or nickel (Ni), and an alloy of the combination thereof. In the exemplary embodiment, each of the connection lines CL includes or is made of copper (Cu) suitable for ultrasonic bonding to another component such as a pad.

As illustrated in FIG. 3, the panel pads PPD may be arranged on a top surface of the display panel DP, and the first board pads FPD may be arranged on a top surface of the circuit board FCB. The plurality of connection lines CL are arranged on a lower surface of the connection board CB. In the display device DD, the connection board CB connected to the display panel DP and the circuit board FCB disposes the lower surface of the connection board CB facing each of the top surface of the display panel DP and the top surface of the circuit board FCB. Thus, when the panel pads PPD and the connection lines CL are connected to each other, a partial region of the connection board CB overlaps a portion of the top surface of the display panel DP along the third direction DR3 (e.g., a thickness direction of the display device DD and/or components thereof). Also, when the first board pads FPD and the connection lines CL are connected to each other, a partial region of the connection board CB overlaps a portion of the top surface of the circuit board FCB along the third direction DR3.

The display panel DP includes a base substrate SUB, a circuit layer CRL disposed on the base substrate SUB, a display element layer ED, and a thin film encapsulation layer TFE. The base substrate SUB may include at least one plastic film. The base substrate SUB is a flexible substrate and may include a plastic substrate, a glass substrate, a metal substrate, an organic/inorganic composite material substrate, or the like.

The circuit layer CRL may include a plurality of insulation layers, a plurality of conductive layers and a semiconductor layer. The plurality of conductive layers of the circuit layer CRL may constitute signal lines through which various signals (e.g., control signal, driving signal, power signal, data signal, scan signal, image signal, etc.) and/or a control circuit of pixels PX.

The display element layer ED may a plurality of organic light emitting diodes which are light emitting elements. Light may be generated and/or emitted from the display element layer ED to display an image IM. The display element layer ED may further include an organic film such as a pixel definition layer. The display element layer ED may be connected to the circuit layer CRL. The display element layer ED may be driven and/or controlled by components within the circuit layer CRL to generate and/or emit light.

The thin film encapsulation layer TFE seals the display element layer ED on the base substrate SUB. The thin film encapsulation layer TFE includes at least one insulation layer. The thin film encapsulation layer TFE may include at least one inorganic film (hereinafter, referred to as an encapsulation inorganic film). The thin film encapsulation layer TFE according to the embodiment of the invention may include at least one organic film (hereinafter, referred to as an encapsulation organic film) and at least one encapsulation inorganic film.

The encapsulation inorganic film protects the display element layer ED against moisture and/or oxygen, and the encapsulation organic film protects the display element layer ED against impurities such as dust particles. The encapsulation inorganic film may include, but not particularly limited to, a silicon nitride layer, a silicon oxynitride layer, a silicon oxide layer, a titanium oxide layer, or an aluminum oxide layer. The encapsulation organic film may include, but not particularly limited to, an acrylic-based organic film.

In another embodiment, the display panel DP may include an encapsulation substrate instead of the thin film encapsulation layer TFE, to seal the display element layer ED on the base substrate SUB. The encapsulation substrate may include or be made of glass, sapphire, plastic, or the like.

The display panel DP connected to the connection board CB disposes the panel pads PPD arranged on the circuit layer CRL of the display panel DP.

The connection board CB includes a first base substrate BS1 and the plurality of connection lines CL which are arranged spaced apart from each other on the bottom surface of the first base substrate BS1. The first base substrate BS1 may include or be made of a flexible material, for example, a polyimide.

The circuit board FCB include a second base substrate BS2 and a conductive layer ML which is arranged on the top surface of the second base substrate BS2. The second base substrate BS2 may include or be made of a flexible material, for example, a polyimide.

The conductive layer ML may include signal lines to transmit driving signals from the driving integrated circuit DIC to the first board pads FPD. That is, the display panel DP receives signals (e.g., driving signals) from outside thereof (e.g., from the circuit board FCB), through the connection board CB.

According to one or more embodiment of the invention, the panel pads PPD and the first end portions of the connection lines CL are connected to each other, such as being in direct contact with each other, through an ultrasonic bond (e.g., direct bond) provided through an ultrasonic bonding method. The ultrasonic bonding method may be a bonding method by means of pressurization (pressure) and vibration. In an exemplary embodiment of a bonding method, for example, the connection line CL of the connection board CB may be disposed above the panel pad PPD, in the third direction DR3. Subsequently, a pressing part (not shown), which is disposed above the connection board CB may apply vertical pressure and generate vibration while pressing against a first pad among the panel pads PPD. In an exemplary embodiment, for example, the pressing part may generate about 50 kilohertz (kHz) of vibration.

Accordingly, frictional heat is generated at the interface between the panel pad PPD and the connection line CL, and thus the panel pad PPD and the connection line CL may be bonded (or melt) to each other to provide a direct bond. As an example, the panel pad PPD and the connection line CL may each be provided as metal materials so that the panel pad PPD and the connection line CL generate frictional heat. In the exemplary embodiment, the connection line CL is copper (Cu). However, materials of the panel pad PPD and the connection line CL are not limited thereto, and various materials capable of generating frictional heat may be provided.

As the number of the pixels PX provided in the display panel DP increases, the number of the panel pads PPD within the display panel DP also increases. Since the surface area of the display panel DP at the first pad area PA1 is limited, a pitch (e.g., spacing) between adjacent ones among the panel pads PPD becomes relatively small when the number of the panel pads PPD within the first pad area PA1 increases.

In another embodiment, a display panel DP may be directly bonded or in direct contact with a circuit board FCB by omitting the connection board CB. One of methods for directly bonding the display panel DP and the circuit board FCB to each other by omitting the connection board CB is to use an anisotropic conductive film ("ACF"). The bonding method using the ACF makes use of a metal conductive ball, but when a pitch between the panel pads PPD is relatively small, the connection quality between the panel pads PPD and the first board pads FPD may be deteriorated.

Also, in mounting of the driving integrated circuit DIC on the circuit board FCB, the conductive layer ML of the circuit board FCB may be a tin-silver alloy, a tin-copper alloy, a tin-silver-copper alloy, a tin-bismuth alloy, a tin-zinc alloy, a tin-indium alloy, or a tin-indium-bismuth alloy. As such, the bonding method using the ACF is applied during a process to mount the driving integrated circuit DIC on the circuit board FCB since tin is unsuitable for the ultrasonic bonding method.

According to one or more embodiment of the invention, the connection lines CL of the connection board CB include copper, and thus may be directly-bonded (e.g., by providing a "direct bond") with the panel pads PPD by means of the ultrasonic method. Also, the connection lines CL and the first board pads FPD may be in direct contact with each other (e.g., mechanically or physically in contact with each other) through a method such as bonding using the ACF, solder bonding, or the like.

In other embodiments, where the connection lines CL are directly-bonded (e.g., by providing a "direct bond") with the panel pads PPD, the connection lines CL and the first board pads FPD may be considered as bonded to each other by a non-direct bond (e.g., the ACF, solder bonding, or the like being applied between the connection lines CL and the first board pads FPD).

Figure 4:
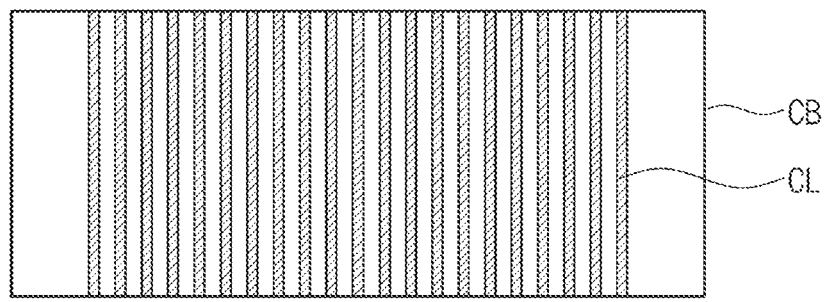
FIG. 4 is a top plan view of an exemplary embodiment of a connection board.
Figure 4:
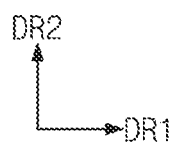

FIG. 4 is a top plan view of an exemplary embodiment of a connection board.

Referring to FIG. 4, a connection board CB defines a width which extends along a second direction DR2 and includes a plurality of connection lines CL arranged spaced apart from each other along a length of the connection board CB (e.g., along a first direction DR1). The connection lines CL may define a width (e.g., line width) along the first direction DR1 and a length along the second direction DR2. As illustrated in FIG. 4, the plurality of connection lines CL have the same line width and are arranged equidistantly spaced apart from each other, but the invention is not limited thereto. The line widths of the plurality of connection lines CL and/or the distances between the connection lines CL may be diversely changed.

Figure 5A:
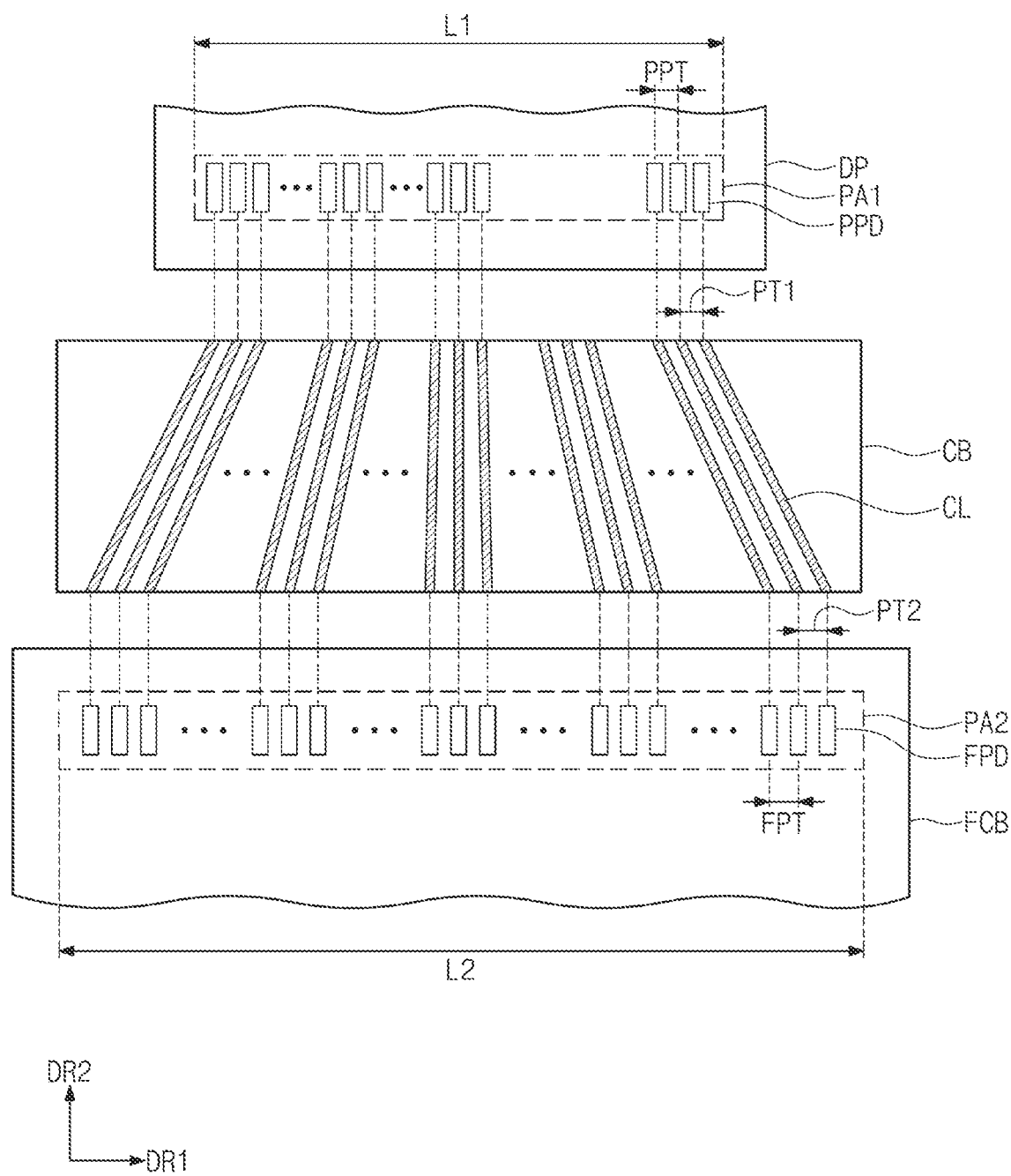
FIG. 5A and FIG. 5B are top plan views of another exemplary embodiment of a connection board.
Figure 5B:
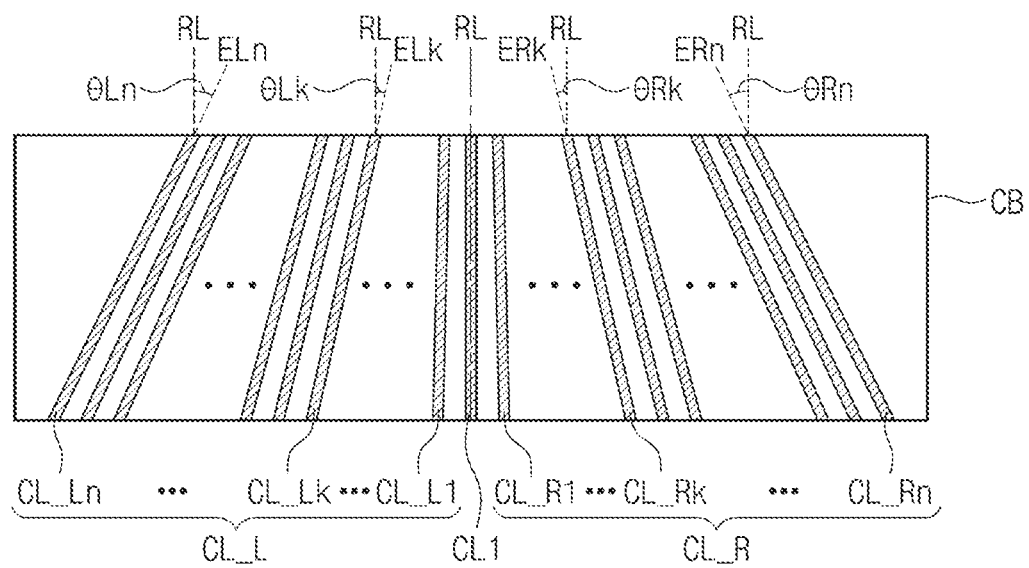
Figure 5B:
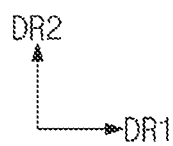

FIG. 5A and FIG. 5B are top plan views of another embodiment of a connection board.

Referring to FIG. 5A, a distance along a first direction DR1, of a first pad area PA1 in which panel pads PPD of a display panel DP are arranged is a first length L1. A distance along the first direction DR1, of a second pad area PA2 in which first board pads FPD of a circuit board FCB are arranged is a second length L2. The first length L1 of the first pad area PA1 and the second length L2 of the second pad area PA2 may be different from each other. The first length L1 and the second length L2 may represent a maximum dimension of the first pad area PA1 and the second pad area PA2, respectively, along the first direction DR1.

Connection lines CL may be inclined with respect to the first direction DR1 and/or the second direction DR2, to define a slope or angle relative to a respective direction. As illustrated in FIG. 5A, when the second length L2 of the second pad area PA2 is greater than the first length L1 of the first pad area PA1, slopes of a plurality of connection lines CL of a connection board CB may be different from each other along a length of the connection board CB (e.g., along the first direction DR1).

Referring to FIG. 5A and FIG. 5B, the connection lines CL are arranged side-by-side along the first direction DR1. The connection board CB and the display panel DP may be connected to each other by first end portions of the connection lines CL being in contact with the panel pads PPD, respectively. The connection board CB and the circuit board FCB may be connected to each other at second end portions of the connection lines CL being in contact with the first board pads FPD, respectively.

A first edge and a second edge of the connection board CB are disposed facing each other along the second direction DR2 and each lengthwise extend along the first direction DR1. The first edge is disposed closer to the display panel DP than the second edge. A spacing between connection lines CL at the first edge may be different than a spacing between connection lines at the second edge.

A gap PT1 between the first end portions of the connection lines CL at the first edge thereof, is equal to a gap PPT between the panel pads PPD of the display panel DP. Also, a gap PT2 between the second end portions of the connection lines CL at the second edge thereof, is equal to a gap FPT between the first board pads FPD of the circuit board FCB. As illustrated in FIG. 5A, the gap PT1 between the first end portions is less than the gap PT2 between the second end portions.

The gaps PPT between the panel pads PPD within the display panel DP may be equal to each other and gaps FPT between the first board pads FPD within the circuit board FCB may be equal to each other, but the invention is not limited thereto. In an exemplary embodiment, the gaps PPT between the panel pads PPD may be different from each other, and the gaps FPT of the first board pads FPD may also be different from each other.

The connection lines CL include a first connection line CL1 (e.g., first connection line group CL1), a second connection line group CL_L, and a third connection line group CL_R. In FIG. 5B, the second connection line group CL_L is disposed on the left side of the first connection line CL1, and third connection line group CL_R is disposed on the right side of the first connection line CL1.

The second connection line group CL_L includes second connection lines CL_L1 to CL_Ln, and the third connection line group CL_R includes third connection lines CL_R1 to CL_Rn. Here, n is an integer of 1 or more, and the number of the second connection lines CL_L1 to CL_Ln and the number of the third connection lines CL_R1 to CL_Rn may be equal to or different from each other. The second connection lines CL_L1 to CL_Ln and the third connection lines CL_R1 to CL_Rn may be respectively disposed symmetrical with respect to the first connection line CL1, without being limited thereto. The first connection line CL_Lk and the second connection line CL_Rk may be the k-th connection line from the first connection line CL1, in respective directions opposite to each other along the first direction DR1. The k-th connection line and the n-th connection line may be disposed at a same distance, at a same sequential position, etc. from the first connection line CL1.

Each of the first connection line CL1, the second connection lines CL_L1 to CL_Ln, and the third connection lines CL_R1 to CL_Rn may have a predetermined slope with respect to a reference line RL. The reference line RL may be a virtual line parallel to a second direction DR2 crossing the first direction DR1. The first direction DR1 and the second direction DR2 may be perpendicular to each other, but the invention is not limited thereto. The first connection line CL1 is disposed in a central portion of the connection board CB with respect to a length thereof along the first direction DR1, and has a first slope with respect to the reference line RL. An extension direction of the first connection line CL1 may be parallel to the reference line RL, without being limited thereto. Each of the second connection lines CL_L1 to CL_Ln and the third connection lines CL_R1 to CL_Rn may have a slope different from the first slope with respect to the reference line RL.

As a distance from the first connection line CL1 increases along the first direction DR1, the slopes of the second connection lines CL_L1 to CL_Ln and the third connection lines CL_R1 to CL_Rn may increase. In an exemplary embodiment, for example, the slope of the second connection line CL_Lk that is the k-th connection line from the first connection line CL1 disposed in the central portion, and the slope of the second connection line CL_Ln that is the n-th connection line from the first connection line CL1 may be different from each other. Also, the slope of the second connection line CL_Ln may be greater than the slope of the second connection line CL_Lk. Similarly, the slope of the third connection line CL_Rn may be greater than the slope of the third connection line CL_Rk. The slope of each of the second connection line CL_Lk and the third connection line CL_Rk may be greater than the first slope of the first connection line CL1.

The slope of each of the first connection line CL1, the second connection lines CL_L1 to CL_Ln, and the third connection lines CL_R1 to CL_Rn may represent an included angle formed between the extension direction of the reference line RL and the extension direction of each of the first connection line CL1, the second connection lines CL_L1 to CL_Ln, and the third connection lines CL_R1 to CL_Rn. In the present specification, the slope has a positive value and represents an acute angle.

Referring to FIG. 5B, for example, an extension directional line ELk from the second connection line CL_Lk has an included angle θLk with respect to the reference line RL. An extension directional line ELn from the second connection line CL_Ln has an included angle θ Ln with respect to the reference line RL. An extension directional line ERk from the third connection line CL_Rk has an included angle θRk with respect to the reference line RL. An extension directional line ERn from the third connection line CL_Rn has an included angle θRn with respect to the reference line RL. In the embodiment, the included angle θLk and the included angle θRk may be substantially equal to each other, and the included angle θ Ln and the included angle θRn may be substantially equal to each other. In the exemplary embodiment, the first connection line CL1, the second connection lines CL_L1 to CL_Ln, and the third connection lines CL_R1 to CL_Rn are illustrated and described as straight lines having predetermined slopes, but the invention is not limited thereto.

Although, the first length L1 of the first pad area PA1 in which the panel pads PPD are arranged is less than the second length L2 of the second pad area PA2 in which the first board pads FPD of the circuit board FCB are arranged as illustrated herein, the display panel DP and the circuit board FCB may be connected to each other using the connection board CB.

Figure 6A:
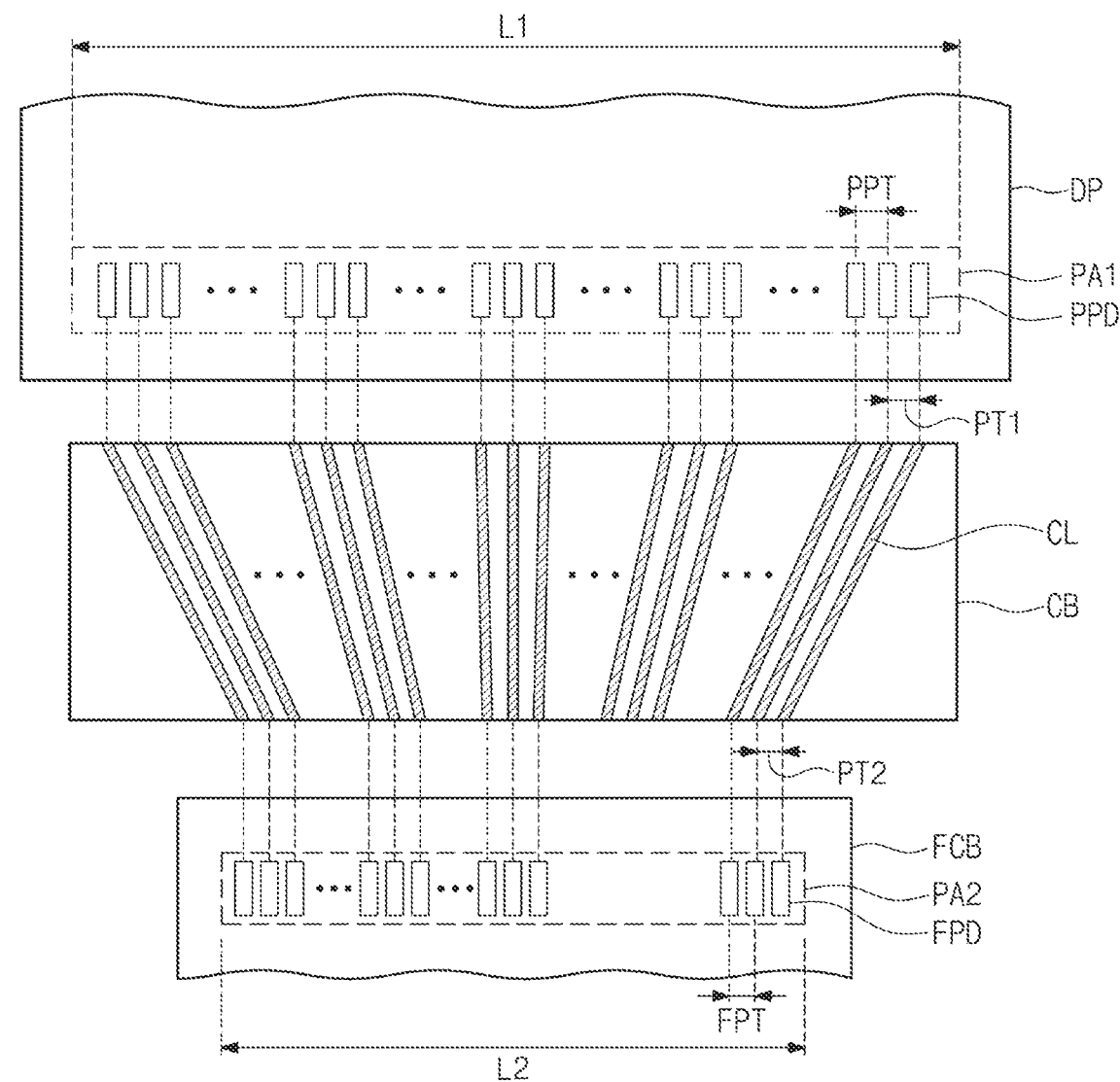
FIG. 6A and FIG. 6B are top plan views of still another exemplary embodiment of a connection board.
Figure 6B:
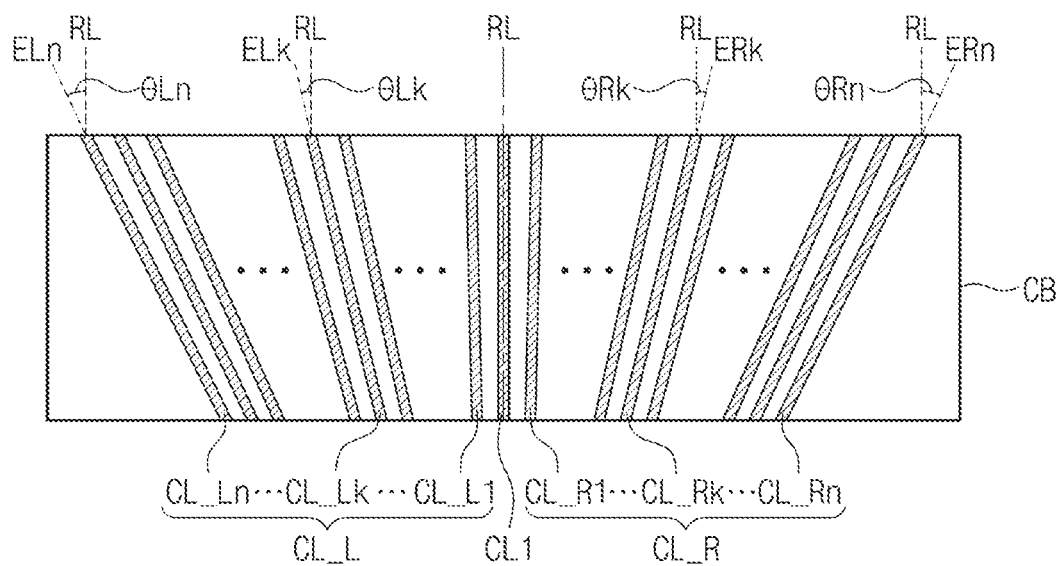

FIG. 6A and FIG. 6B are top plan views of still another embodiment of a connection board. When describing FIG. 6A and FIG. 6B, the duplicated features with those of FIGS. 5A and 5B are not described again, but their differences will be mainly described.

Referring to FIG. 6A, a distance along a first direction DR1, of a first pad area PA1 in which panel pads PPD of a display panel DP are arranged is a first length L1. A distance along the first direction DR1, of a second pad area PA2 in which first board pads FPD of a circuit board FCB are arranged is a second length L2. The first length L1 of the first pad area PA1 and the second length L2 of the second pad area PA2 may be different from each other.

As illustrated in FIG. 6A, when the first length L1 of the first pad area PA1 is greater than the second length L2 of the second pad area PA2, slopes of a plurality of connection lines CL of a connection board CB may be different from each other.

Referring to FIG. 6A and FIG. 6B, the connection lines CL are arranged side-by-side along the first direction DR1. First end portions of the connection lines CL may be in contact with the panel pads PPD, respectively, and second end portions may be in contact with the first board pads FPD, respectively. A gap PT1 between the first end portions of the connection lines CL is equal to a gap PPT between the panel pads PPD. Also, a gap PT2 between the second end portions of the connection lines CL is equal to a gap FPT between the first board pads FPD. In the exemplary embodiment, the gap PT1 of the first end portions is greater than the gap PT2 of the second end portions. The exemplary embodiment describes that gaps PPT between the panel pads PPD are equal to each other and gaps FPT between the first board pads FPD are equal to each other, but the embodiment of the invention is not limited thereto. The gaps PPT between the panel pads PPD may be different from each other, and the gaps FPT of the first board pads FPD may also be different from each other.

The connection lines CL include a first connection line CL1, a second connection line group CL_L, and a third connection line group CL_R. The second connection line group CL_L is disposed on the left side of the first connection line CL1, and third connection line group CL_R is disposed on the right side of the first connection line CL1.

The second connection line group CL_L includes second connection lines CL_L1 to CL_Ln, and the third connection line group CL_R includes third connection lines CL_R1 to CL_Rn. Here, n is an integer of 1 or more, and the number of the second connection lines CL_L1 to CL_Ln and the number of the third connection lines CL_R1 to CL_Rn may be equal to or different from each other.

Each of the first connection line CL1, the second connection lines CL_L1 to CL_Ln, and the third connection lines CL_R1 to CL_Rn may have a predetermined slope. A reference line RL may be a virtual line parallel to a second direction DR2 crossing the first direction DR1. The first connection line CL1 disposed in a central portion of the connection board CB has a first slope with respect to the reference line RL, and each of the second connection lines CL_L1 to CL_Ln and the third connection lines CL_R1 to CL_Rn may have a second slope different from the first slope.

As a distance from the first connection line CL1 increases along the first direction DR1, the slopes of the second connection lines CL_L1 to CL_Ln and the third connection lines CL_R1 to CL_Rn may increase. In an exemplary embodiment, for example, the slope of the second connection line CL_Lk that is the k-th connection line from the first connection line CL1 disposed in the central portion and the slope of the second connection line CL_Ln that is the n-th connection line from the first connection line CL1 may be different from each other. Also, the slope of the second connection line CL_Ln may be greater than the slope of the second connection line CL_Lk. Similarly, the slope of the third connection line CL_Rn may be greater than the slope of the third connection line CL_Rk.

The slope of each of the first connection line CL1, the second connection lines CL_L1 to CL_Ln, and the third connection lines CL_R1 to CL_Rn may represent an included angle formed between the extension direction of the reference line RL and the extension direction of each of the first connection line CL1, the second connection lines CL_L1 to CL_Ln, and the third connection lines CL_R1 to CL_Rn. In the present specification, the slope has a positive value and represents an acute angle.

Although, the first length L1 of the first pad area PA1 in which the panel pads PPD are arranged is greater than the second length L2 of the second pad area PA2 in which the first board pads FPD of the circuit board FCB are arranged as illustrated herein, the display panel DP and the circuit board FCB may be connected to each other using the connection board CB.

Figure 7:
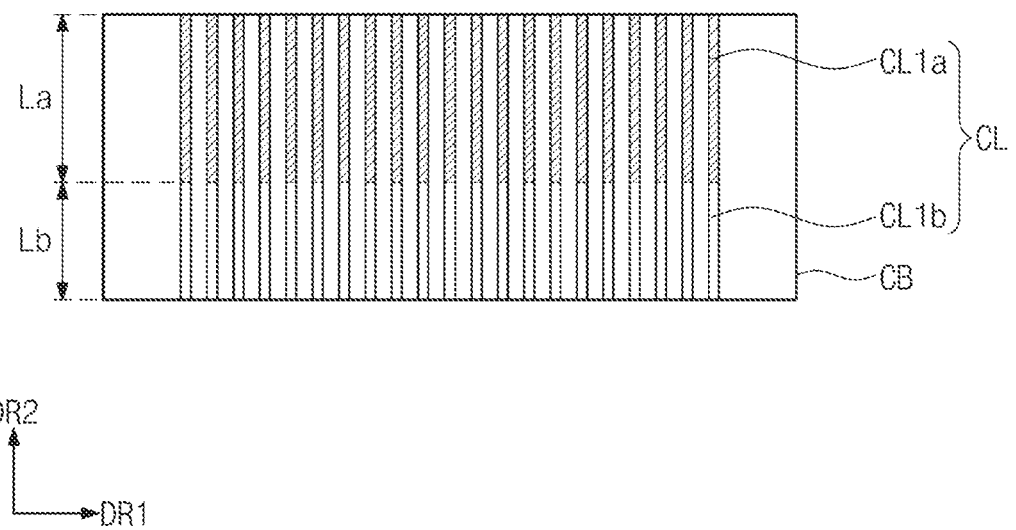
FIG. 7 is a top plan view of yet another embodiment of a connection board.

FIG. 7 is a top plan view of yet another embodiment of a connection board.

Referring to FIG. 7, a connection board CB defines a width which extends along a second direction DR2 and includes a plurality of connection lines CL arranged spaced apart from each other along a first direction DR1. The connection lines CL may define a width (e.g., line width) along the first direction DR1 and a length along the second direction DR2. As illustrated in FIG. 7, the plurality of connection lines CL have the same line width and are arranged equidistantly spaced apart from each other, but the invention is not limited thereto. The line widths of the plurality of connection lines CL and the distances between the connection lines CL may be diversely changed.

Each of the connection lines CL includes a first end portion CL1a and a second end portion CL1b which is opposite to the first end portion CL1a along a length of a respective connection line CL. The first end portion CL1a may be connected to a respective one of the panel pads PPD of the display panel DP illustrated in FIG. 2, and the second end portion CL1b may be connected to a respective one of the first board pads FPD of the circuit board FCB illustrated in FIG. 2. That is, the connection lines CL are connected to other components of the display device DD at respective ones of the first end portion CL1a and the second end portion CL1b.

In the exemplary embodiment, the first end portion CL1a includes or is made of copper, but the invention is not limited thereto. In an exemplary embodiment, for example, the first end portion CL1a may include or be made of other metals necessary for ultrasonic bonding with the panel pads PPD. The second end portion CL1b includes or is made of tin (Sn), but the invention is not limited thereto. In an exemplary embodiment, for example, the second end portion CL1b may include metal suitable for bonding using the ACF. That is, a same single one of the connection lines CL may include two different materials which facilitate respective bonding thereof to two different components by two different bonding methods.

The first end portion CL1a has a length La, and the second end portion CL1b has a length Lb. In the exemplary embodiment, the length La and the length Lb are different from each other (La>Lb), but the invention is not limited thereto. In another embodiment, the length La and the length Lb may be equal to each other. A total length of a connection line CL along the second direction DR2 may be a sum of the length La and the length Lb. The length La and the length Lb may together define an entirety of a length of the connection line CL.

Figure 8:
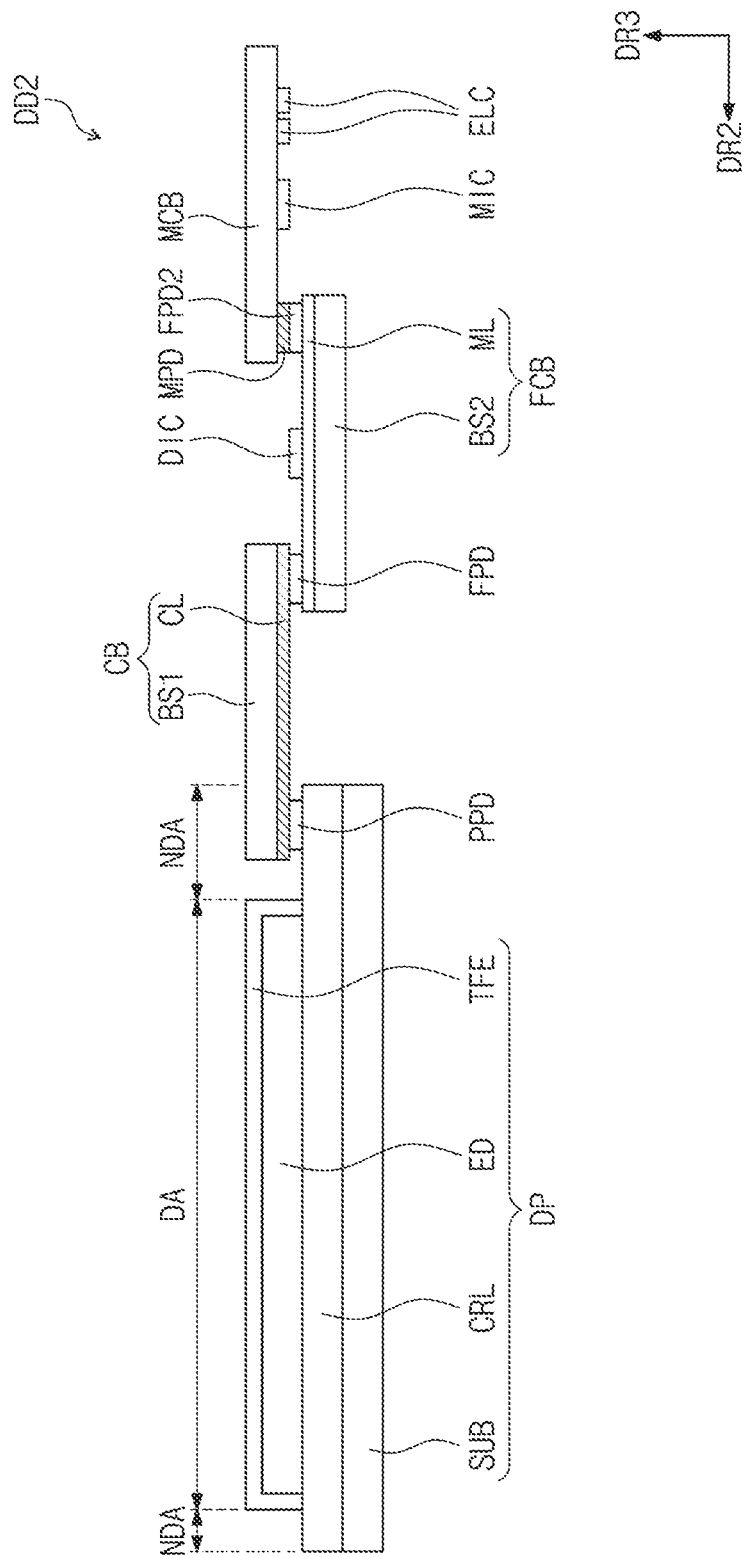
FIG. 8 is a cross-sectional view illustrating another embodiment of an end portion of a display device.

FIG. 8 is a cross-sectional view illustrating another embodiment of a portion of a display device.

A display device DD2 illustrated in FIG. 8 includes all components of the display device DD illustrated in FIG. 3 and further includes a main circuit board MCB.

The main circuit board MCB may be a printed circuit board ("PCB") on which a main integrated circuit MIC may be mounted. A plurality of electronic elements ELC may be further mounted on the main circuit board MCB. The plurality of electronic elements ELC may include passive elements and/or active elements. Various signals, power, etc. may be applied from the main circuit board MCB which is external to the circuit board FCB, the connection board CB and the display panel DP, to one or more of the circuit board FCB, the connection board CB and the display panel DP.

A main pad MPD of the main circuit board MCB is connected to a second board pad FPD2 of a circuit board FCB. In an exemplary embodiment, for example, the main pad MPD and the second board pad FPD2 may be bonded to each other using an anisotropic conductive film ("ACF").

Figure 9:
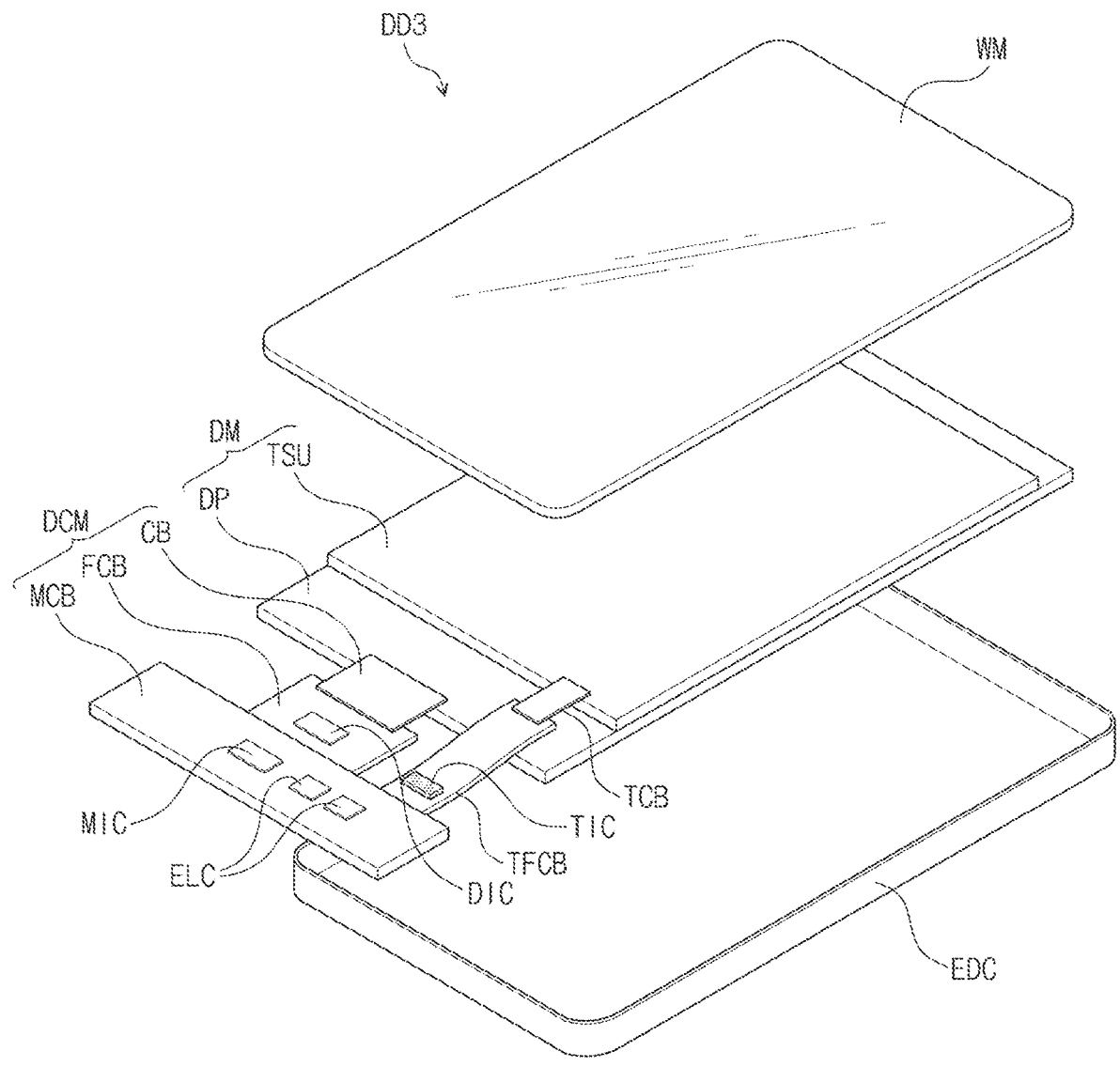
FIG. 9 is a perspective view of still another exemplary embodiment of a display device.

FIG. 9 is a perspective view of still another embodiment of a display device.

Referring to FIG. 9, a display device DD3 includes a window member WM, a display module DM, a driving module DCM, and an outer case EDC. The window member WM provides the front surface of the display device DD3. The window member WM may include a glass substrate, a sapphire substrate, a plastic substrate, or the like. An image IM is viewable from outside the display device DD3 through the window member WM.

The window member WM may include one or more among functional coating layers such as an anti-fingerprint layer, an anti-reflection layer, and a hard coating layer. The exemplary embodiment illustrates that the window member WM appears flat at an area overlapping the display panel DP, but a shape of the window member WM may be changed. Outer edges of the window member WM facing each other along a first direction DR1, may provide curved surfaces which further extend along the second direction DR2 and the third direction DR3.

The display module DM is disposed on the bottom surface of the window member WM and generates an image IM. Also, the display module DM includes a touch sensing unit TSU with which an input (e.g., touch input) from outside the display device DD3 (e.g., a touch from a user and/or a pressure applied by a user) is sensed and a display panel DP which generates and displays the image IM. The touch sensing unit TSU and the display panel DP may be electrically connected to a driving module DCM.

A sensing signal may be provided from the touch sensing unit TSU to the driving module DCM and/or may be provided to the touch sensing unit TSU from the driving module DCM. The touch sensing unit TSU may include a sensing area at which a touch input is sensed, a non-sensing area adjacent to the sensing area, and a plurality of touch pads (not shown) disposed in the non-sensing area. The sensing area and the non-sensing area may correspond to the display area DA and the non-display area NDA of the display panel DP, but is not limited thereto.

In FIG. 9, the display module DM is shown providing a flat display surface as an example, however, a shape of the display module DM may be changed. Outer edges of the display module DM facing each other along the first direction DR1, may be bent in a direction away from center portion of the display surface to provide curved surfaces.

The outer case EDC provides an outer surface of the display device DD3. The outer case EDC having one body is illustrated as an example, however, the outer case EDC may include a plurality of separate bodies which are assembled to each other to form the outer case EDC. The outer case EDC may include a plurality of frames and/or plates including or made of materials among glass, plastic, and metal.

The driving module DCM includes a connection board CB, a circuit board FCB, a main circuit board MCB, a touch connection board TCB, and touch circuit board TFCB. The main circuit board MCB is electrically connected to the circuit board FCB and the touch circuit board TFCB.

Respective connections between the display panel DP, the connection board CB, the circuit board FCB and the main circuit board MCB may be the same as the connection configuration illustrated in FIG. 8.

The touch circuit board TFCB may be a flexible printed circuit board ("FPCB") on which a touch driving integrated circuit TIC (e.g., touch driving circuit TIC) may be mounted. The touch driving circuit TIC provides a touch driving signal configured to drive the touch sensing unit TSU. The touch driving signal may be provided from the touch circuit board TFCB on which the touch driving circuit TIC is mounted, to the touch sensing unit TSU through the touch connection board TCB.

The touch connection board TCB electrically connects the touch sensing unit TSU and the touch circuit board TFCB to each other. In the exemplary embodiment, the touch connection board TCB may have a similar or same structure as the connection board CB illustrated in FIG. 4 to FIG. 7. Therefore, the touch connection board TCB may be in contact with touch pads (not shown) of the touch sensing unit TSU by means of ultrasonic bonding, similar to how the connection board CB is in contact with panel pads PPD of the display panel DP by ultrasonic bonding (e.g., a direct bond). The touch connection board TCB may be bonded to the touch circuit board TFCB by using an anisotropic conductive film ("ACF") similar to how the connection board CB is connected to the circuit board FCB.

In an exemplary embodiment, the connection between the touch circuit board TFCB and the main circuit board MCB may be the same as the connection between the circuit board FCB and the main circuit board MCB illustrated in FIG. 8. That is, board pads (not shown) of the touch circuit board TFCB may be bonded to main pads (not shown) of the main circuit board MCB by using an anisotropic conductive film ("ACF") similar to how the circuit board FCB is connected to the main circuit board MCB.

In an exemplary embodiment based on the similar connections described above, the touch sensing unit TSU includes a plurality of touch pads (e.g., similar to the panel pad PPD) through which a touch driving signal is provided to the touch sensing unit TSU from outside thereof, the touch circuit board TFCB connected to the touch sensing unit TSU includes a plurality of touch connection pads (e.g., similar to the first board pads FPD) through which the touch driving signal is provided from the touch circuit board TFCB to the touch connection board TCB, and the touch connection board TCB which connects the touch sensing unit TSU to the touch circuit board TFCB includes a plurality of touch connection lines (e.g., similar to connection lines CL) spaced apart from each other. Each of a touch connection line among the plurality of the touch connection lines includes a first end portion at which the touch connection line is connected to the touch sensing unit TSU, the first end portion of the touch connection line being in direct contact with a touch pad among the plurality of touch pads, and a second end portion at which the touch connection line is connected to the touch circuit board TFCB, the second end portion of the touch connection line being in direct contact with a touch connection pad among the plurality of touch connection pads.

Figure 10:
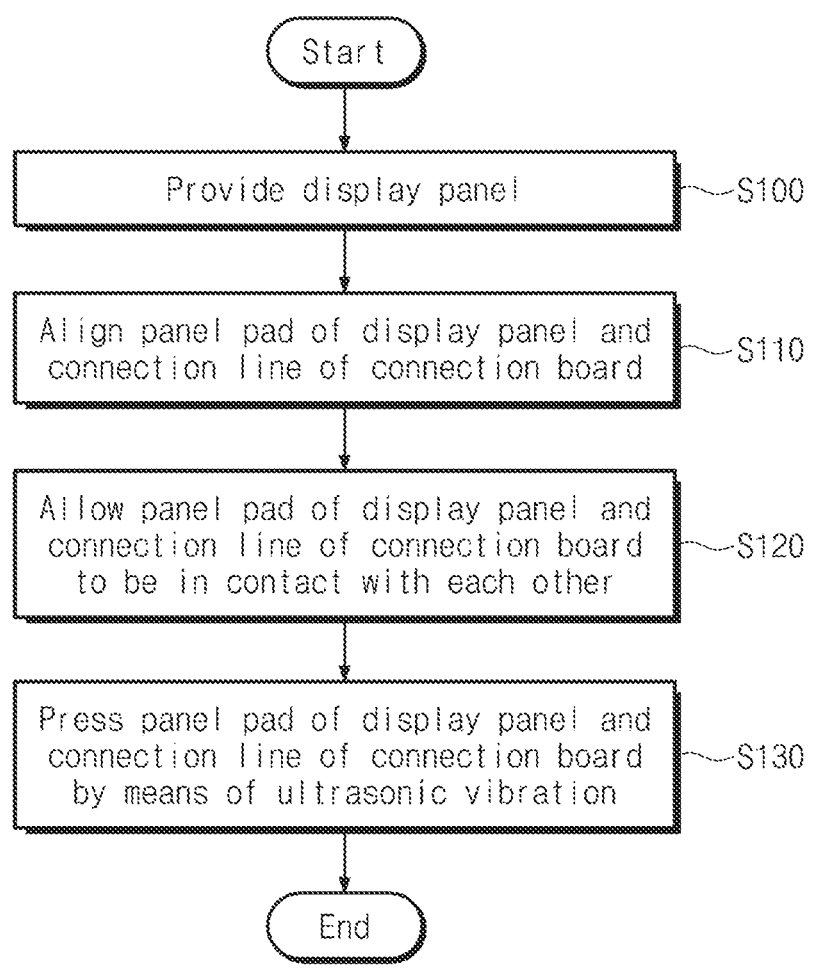
FIG. 10 is a flowchart illustrating an exemplary embodiment of a method for manufacturing a display device.

FIG. 10 is a flowchart illustrating an exemplary embodiment of a method for manufacturing a display device.

In order to understand the manufacturing method illustrated in FIG. 10, the display device illustrated in FIG. 3 is referred, but the invention is not limited to the display device illustrated in FIG. 3.

Referring to FIG. 3 and FIG. 10, the display panel DP including the panel pad PPD is provided (S100). The connection board CB including the connection line CL may also be provided.

The panel pad PPD of the display panel DP and the connection line CL of the connection board CB are aligned with each other (S110).

The panel pad PPD of the display panel DP and the connection line CL of the connection board CB are contacted with each other (S120).

Ultrasonic vibration is applied to the panel pad PPD of the display panel DP and the connection line CL of the connection board CB to press the panel pad PPD and the connection line CL to each other (S130). Here, the ultrasonic bonding method may be a bonding method by means of pressurization (pressure) and vibration. The ultrasonic bonding method may provide a direct bond between the display panel DP and the connection board CB, at the panel pad PPD and the connection line CL, respectively. The pressure and vibration may be applied together with the panel pad PPD of the display panel DP and the connection line CL of the connection board CB contacted with each other.

In one or more embodiment of the display device having the above-described configurations, the display panel and the circuit board may be connected to each other using the connection board. In particular, the connection lines of the connection board are directly connected to the panel pads of the display panel (e.g., a directly bonded) such as by means of the ultrasonic vibration, such that the connection reliability between the display panel and the circuit board may be enhanced.

Although described with reference to various embodiments, it various changes and modifications of the embodiments can be made by one ordinary skilled in the art within the spirit and scope of the invention as hereinafter claimed. Also, the embodiments disclosed in the present disclosure are not intended to limit the technical ideas of the present disclosure, and all technical ideas within the following claims and their equivalents should be interpreted to be included in the scope of right in the present disclosure.

What is claimed is:

1. A display device comprising:
   a display panel comprising a substrate and a panel pad which is on the substrate;
   a circuit board which provides a driving signal; and
   a connection board which connects the display panel to the circuit board, the connection board comprising:
   a flexible substrate having a first edge and a second edge which are opposite to each other, and
   a connection line which is on the flexible substrate and extends from the first edge to the second edge, the connection line comprising:
      a first end portion which is on the first edge of the flexible substrate and is between the substrate of the display panel and the flexible substrate of the connection board, along a thickness direction of the display device, and
      the first end portion of the connection line is directly connected to the panel pad of the display panel by an ultrasonic vibration bond.

2. The display device of claim 1, wherein the circuit board is a flexible circuit board.

3. The display device of claim 2, wherein the circuit board comprises a driving integrated circuit which provides a driving signal.

4. The display device of claim 1, wherein
   the first end portion of the connection line which is in direct contact with the panel pad of the display panel by the ultrasonic vibration bond comprises copper, and
   the ultrasonic vibration bond defines a direct bond between the panel pad of the display panel and the copper at the first end portion of the connection line.

5. The display device of claim 2, wherein
   the circuit board comprises a first board pad, and
   the connection line further comprises a second end portion disposed on the second edge of the connection board and in direct contact with the first board pad, along a thickness direction of the display device.

6. The display device of claim 5, wherein
   the connection board is disposed between the display panel and the circuit board, along a first direction,
   the connection line is provided in plural including a plurality of connection lines, and
   along a second direction crossing the first direction, the plurality of connection lines comprises:
      a first connection line disposed at a central portion of the connection board; and
      a second connection line arranged adjacent to the first connection line.

7. The display device of claim 6, wherein the display panel further comprises:
   a display area and a non-display area which is adjacent to the display area;
   the panel pad provided in plural including a plurality of panel pads;
   a panel pad area in which the plurality of panel pads are disposed, the panel pad area corresponding to the non-display area; and
   a display element layer corresponding to the display area.

8. The display device of claim 7, wherein the circuit board further comprises:
   the first board pad provided in plural including a plurality of first board pads, and
   a board pad area in which the plurality of first board pads are disposed.

9. The display device of claim 8, wherein
   a virtual reference line extends parallel to the first direction,
   a first length of the panel pad area along the second direction is different from a second length of the board pad area along the second direction,
   the first connection line disposed at the central portion of the connection board along the second direction, has a first slope with respect to the virtual reference line, and the second connection line arranged adjacent to the first connection line along the second direction, has a second slope with respect to the virtual reference line different from the first slope.

10. The display device of claim 9, wherein
the second length is greater than the first length, and
the second slope is greater than the first slope.

11. The display device of claim 5, further comprising a main circuit board electrically connected to the circuit board,
wherein the circuit board further comprises a second board pad through which a driving signal is provided to the circuit board from the main circuit board, the main circuit board being electrically connected to the circuit board at the second board pad thereof.

12. The display device of claim 7, further comprising an input sensor disposed on the display panel,
wherein the input sensor comprises:
a sensing area,
a non-sensing area adjacent to the sensing area, and
an input pad disposed in the non-sensing area.

13. The display device of claim 12, further comprising:
an input sensing circuit board electrically connected to the input sensor and comprising an input sensing connection pad, and
an input sensing connection board which electrically connects the input sensor to the input sensing circuit board, the input sensing connection board comprising an input sensing connection line,
wherein the input sensing connection line comprises:
a first end portion at which the input sensing connection line is connected to the input sensor, the first end portion of the input sensing connection line being in direct contact with the input pad, and
a second end portion at which the input sensing connection line is connected to the input sensing circuit board, the second end portion of the input sensing connection line being in contact with the input sensing connection pad.

14. The display device of claim 13, wherein each of the input sensing connection board and the input sensing circuit board is a flexible circuit board.

15. The display device of claim 13, further comprising a touch driving circuit which provides a touch driving signal to drive the input sensor.

16. The display device of claim 13, wherein
the first end portion of the input sensing connection line which is in direct contact with the input pad comprises copper, and
a direct bond is defined between the input pad and the copper at the first end portion of the input sensing connection line to dispose the first end portion of the input sensing connection line in direct contact with the input pad.

17. The display device of claim 13, further comprising a main circuit board electrically connected to each of the circuit board and the input sensing circuit board.

18. The display device of claim 5, wherein within the connection line:
the first end portion comprises copper, and
the second end portion comprises tin.

19. The display device of claim 5, wherein within the connection line, the first end portion comprises a first material and the second end portion comprises a second material different from the first material.

* * * * *